United States Patent
Kudo et al.

(10) Patent No.: US 9,880,224 B2
(45) Date of Patent: Jan. 30, 2018

(54) BATTERY SYSTEM MONITORING DEVICE

(71) Applicant: Hitachi Automotive Systems, Ltd., Hitachinaka-shi, Ibaraki (JP)

(72) Inventors: Akihiko Kudo, Hitachinaka (JP); Mutsumi Kikuchi, Hitachinaka (JP); Tomonori Kanai, Hitachinaka (JP)

(73) Assignee: Hitachi Automotive Systems, Ltd., Hitachinaka-shi (JP)

( * ) Notice: Subject to any disclaimer, the term of this patent is extended or adjusted under 35 U.S.C. 154(b) by 173 days.

(21) Appl. No.: 14/784,330

(22) PCT Filed: Apr. 19, 2013

(86) PCT No.: PCT/JP2013/061652
§ 371 (c)(1),
(2) Date: Oct. 14, 2015

(87) PCT Pub. No.: WO2014/171013
PCT Pub. Date: Oct. 23, 2014

(65) Prior Publication Data
US 2016/0061901 A1    Mar. 3, 2016

(51) Int. Cl.
*G01R 31/36* (2006.01)
*B60L 11/18* (2006.01)

(52) U.S. Cl.
CPC ...... *G01R 31/3606* (2013.01); *B60L 11/1851* (2013.01); *G01R 31/362* (2013.01); *G01R 31/3658* (2013.01)

(58) Field of Classification Search
CPC .................. G01R 31/3606; B60L 11/1851
(Continued)

(56) References Cited

U.S. PATENT DOCUMENTS

| 2010/0209748 A1* | 8/2010 | Kudo ............... H01M 10/425 429/91 |
| 2011/0316549 A1* | 12/2011 | Coenen ............. G01R 31/026 324/434 |
| 2014/0152261 A1 | 6/2014 | Yamauchi et al. |

FOREIGN PATENT DOCUMENTS

| JP | 2005-3618 A | 1/2005 |
| JP | 2007-46917 A | 2/2007 |

(Continued)

OTHER PUBLICATIONS

Extended European Search Report issued in counterpart European Application No. 13882299.4 dated Oct. 24, 2016 (six (6) pages).
(Continued)

*Primary Examiner* — Samuel Berhanu
*Assistant Examiner* — Tessema Kebede
(74) *Attorney, Agent, or Firm* — Crowell & Moring LLP

(57) ABSTRACT

A battery system monitoring device includes a plurality of battery monitoring circuits, which is respectively provided in cell groups, and a balancing resistor. Each of the battery monitoring circuits includes a cell voltage measurement unit to measure a cell voltage of each single battery cell at predetermined timing, a discharge switch to switch a state of a discharge current which flows from each single battery cell through the balancing resistor, and a balancing control unit configured to control the discharge switch. A filter circuit is connected between the cell voltage measurement unit and each single battery cell. The cell voltage measurement unit determines whether a cell voltage is measured within a transient response period corresponding to a time constant of the filter circuit and corrects a measurement value of a cell voltage by using a correction value correcting a result of the determination.

6 Claims, 7 Drawing Sheets

(58) Field of Classification Search
USPC .......................................... 320/118; 324/426
See application file for complete search history.

(56) References Cited

FOREIGN PATENT DOCUMENTS

| | | |
|---|---|---|
| JP | 2010-81731 A | 4/2010 |
| JP | 2011-75504 A | 4/2011 |
| WO | WO 2012/164761 A1 | 12/2012 |

OTHER PUBLICATIONS

International Search Report (PCT/ISA/210) issued in PCT Application No. PCT/JP2013/061652 dated Jul. 23, 2013 with English-language translation (two (2) pages).

\* cited by examiner

BATTERY SYSTEM MONITORING DEVICE

TECHNICAL FIELD

The present invention relates to a device to monitor a battery system.

BACKGROUND ART

In a hybrid vehicle (HEV), an electric vehicle (EV), or the like, an assembled battery (battery system) including serial connection of a plurality of single battery cells, each of which is a secondary battery, is generally used to secure an intended high-voltage. Conventionally, to such an assembled battery, a battery monitoring circuit including an integrated circuit or the like is connected to each predetermined number of single battery cells. By performing measurement of an interterminal voltage of each single battery cell (cell voltage) or performing a balancing discharge for equalization of remaining capacity of each single battery cell with the battery monitoring circuit, a state of each single battery cell is monitored and managed. During balancing, each single battery cell discharges current according to remaining capacity and a discharge current flows in a balancing resistor through a voltage detection line provided between each single battery cell and the battery monitoring circuit. Here, a voltage drop corresponding to impedance is generated in the voltage detection line.

Recently, a single battery cell with a smaller voltage variation with respect to a variation of remaining capacity is in practical use. When such a single battery cell is used, higher measurement accuracy is required in order to measure a cell voltage and to estimate remaining capacity accurately. Thus, in measurement of a cell voltage during balancing, an influence of a voltage drop in such a voltage detection line described above is getting more significant. Thus, a method of measuring a cell voltage accurately by correcting an amount of a voltage drop in a voltage detection line has been proposed (see PTL 1).

CITATION LIST

Patent Literature

PTL 1: JP 2011-75504 A

SUMMARY OF INVENTION

Technical Problem

In a general assembled battery, an RC filter is inserted between a single battery cell and a battery monitoring circuit in order to control an aliasing error generated by a noise, a voltage variation, or the like. Thus, when balancing is started or stopped, a transient response corresponding to a time constant of the RC filter is generated by a cell voltage. However, by the method described in PTL 1, it is not possible to measure a cell voltage in a period of a transient response accurately although it is possible to accurately measure a cell voltage in a stable state after a transient response from the start of balancing.

Solution to Problem

A battery system monitoring device according to the present invention is configured to monitor and control a battery system including a plurality of cell groups in each of which a plurality of single battery cells is connected in series, and the device includes: a plurality of battery monitoring circuits provided in each of the cell groups; and a balancing resistor configured to cause each of the single battery cells in a cell group corresponding to each of the battery monitoring circuits to discharge current. In the battery system monitoring device, each of the battery monitoring circuits includes a cell voltage measurement unit configured to measure a cell voltage of each of the single battery cells in the corresponding cell group at predetermined timing, a discharge switch configured to switch a state of a discharge current which flows from each of the single battery cells in the corresponding cell group through the balancing resistor, and a balancing control unit configured to control the discharge switch. A filter circuit is connected between the cell voltage measurement unit and each of the single battery cells, and the cell voltage measurement unit determines whether the cell voltage is measured within a transient response period corresponding to a time constant of the filter circuit and corrects a measurement value of the cell voltage by using a correction value corresponding to a result of the determination.

Advantageous Effects of Invention

According to the present invention, it is possible to provide a battery system monitoring device which can measure a cell voltage accurately even in a period of a transient response.

DESCRIPTION OF EMBODIMENTS

In the following, an embodiment of the present invention will be described with reference to the drawings. In the following embodiment, an example of when the present invention is applied to a battery system monitoring device to monitor a battery system used in a hybrid vehicle (HEV) or the like will be described. Note that a range of application of the battery system monitoring device according to the present invention is not limited to what monitors a battery system mounted in the HEV. For example, wide application to a device to monitor a battery system mounted in a plug-in hybrid vehicle (PHEV), an electric vehicle (EV), a railroad vehicle, or the like is also possible.

In the following embodiment, a lithium-ion battery having a predetermined output voltage range such as an output voltage range from 3.0 to 4.2 V (average output voltage: 3.6

V) is assumed as a smallest unit of a battery system to be controlled and monitored by the battery system monitoring device according to the present invention. However, the battery system monitoring device according to the present invention may control and monitor a battery system including a charging/discharging device other than a lithium-ion battery. That is, a battery system may include any kind of charging/discharging device as long as it is necessary to limit utilization when a state of charge (SOC) is too high (overcharge) or too low (over discharge). In the following, a charging/discharging device as a configuration element of such a battery system will be collectively referred to as a single battery cell.

In an embodiment described in the following, a plurality of (about a several to a dozen of) single battery cells connected in series is referred to as a cell group and a plurality of cell groups connected in series is referred to as a battery system. Also, these may be referred to as an assembled battery.

Figure 1:
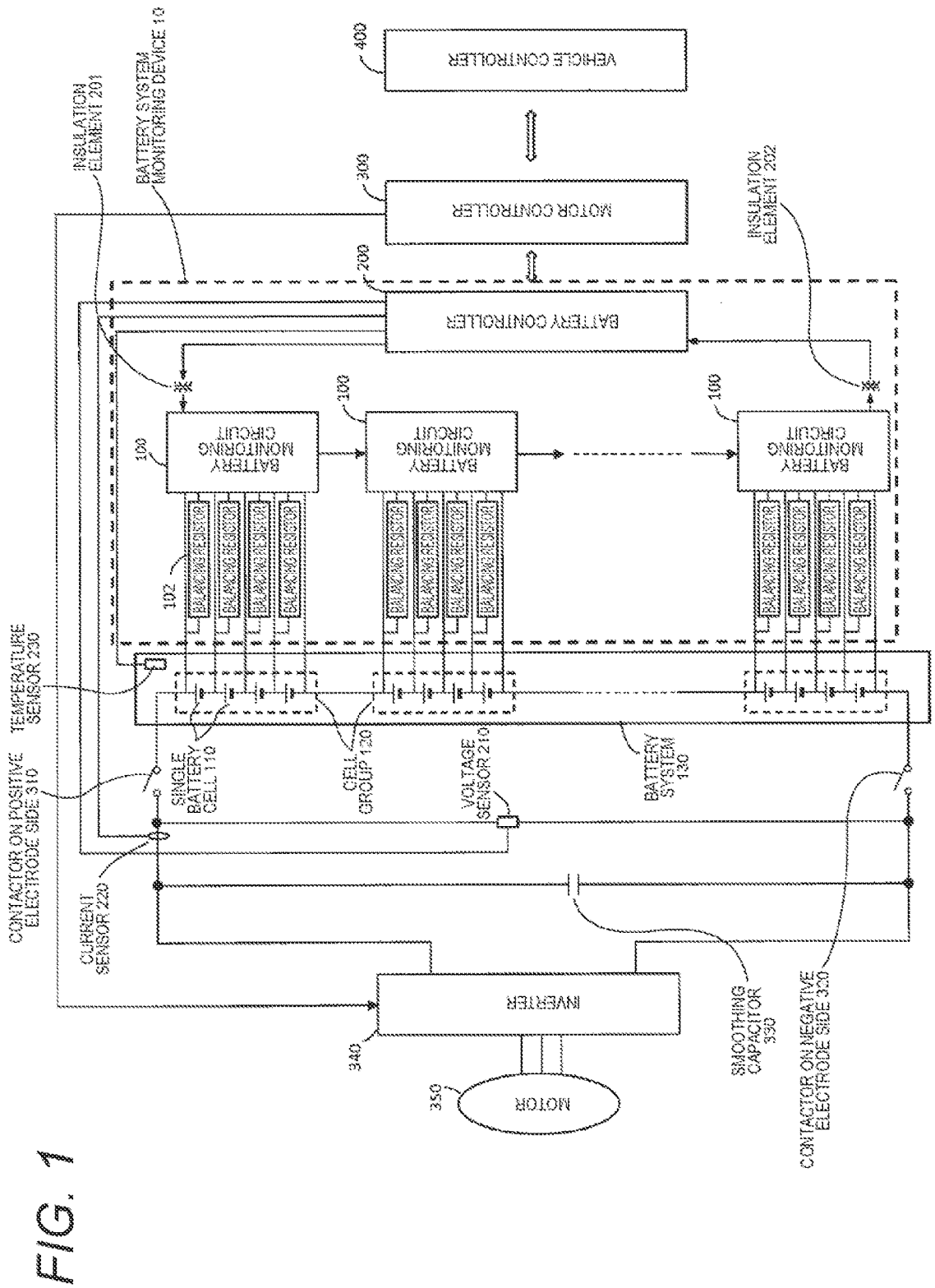
FIG. 1 is a view illustrating a configuration of a battery system monitoring device according to an embodiment of the present invention.

FIG. 1 is a view illustrating a configuration of a battery system monitoring device 10 according to an embodiment of the present invention. The battery system monitoring device 10 includes a battery controller 200 and a plurality of battery monitoring circuits 100 connected to each other in predetermined communication order. The battery system monitoring device 10 is mounted in an electrically-driven vehicle e such as an electric vehicle or a hybrid vehicle along with a vehicle controller 400, a motor controller 300, a battery system 130, an inverter 340, a motor 350, and the like.

In the battery system 130, a plurality of cell groups 120 is connected in series. Each cell group 120 includes a plurality of single battery cells 110 (hereinafter, also simply referred to as cell) connected in series. Each cell 110 is, for example, a secondary battery such as a lithium-ion battery.

In the battery system monitoring device 10, a loop communication circuit is provided between the battery controller 200 and each battery monitoring circuit 100. The battery controller 200 transmits a communication signal to the battery monitoring circuit 100, which is the highest in communication order, through an insulation element 201. The highest-order battery monitoring circuit 100 which receives this communication signal transfers the communication signal to a battery monitoring circuit 100 which is next in the communication order. When these operations are performed serially in each battery monitoring circuits 100, a communication signal is transmitted in series from the highest-order battery monitoring circuit 100 to the lowest-order battery monitoring circuit 100. The battery monitoring circuit 100 which is the lowest in the communication order transmits a communication signal to the battery controller 200 through an insulation element 202. In such a manner, a communication signal is exchanged, through the loop communication circuit, between the battery controller 200 and each battery monitoring circuit 100.

The vehicle controller 400 controls a traveling speed or braking force of a vehicle based on an operation signal from a vehicle driving operation device (not illustrated) such as an accelerator pedal, a brake pedal, or a gearshift lever operated by a driver of an electrically-driven vehicle. The motor controller 300 controls the battery controller 200 and the inverter 340 based on a speed command or a braking force command, which is transmitted from the vehicle controller 400, and controls a rotation speed and torque of the motor 350.

Based on voltage, current, and temperature of the battery system 130 which are respectively detected by a voltage sensor 210, a current sensor 220, and a temperature sensor 230, the battery controller 200 controls charging/discharging and a state of charge (SOC) of the battery system 130. The battery controller 200 controls an operation of each battery monitoring circuit 100 by exchanging a communication signal with each battery monitoring circuit 100 in the above-described manner and estimates the SOC of each of the plurality of cells 110 included in each cell group 120 in the battery system 130. Based on the estimation result, a discharge to correct a variation in the SOC of the cells 110 (hereinafter, referred to as balancing discharge) is performed in such a manner that the SOC of cells 110 becomes even. In such a manner, the battery system monitoring device 10 monitors and controls the battery system 130.

When exchanging a communication signal with each battery monitoring circuit 100 in the above-described manner, the battery controller 200 activates each battery monitoring circuit 100 by outputting an activation signal (not illustrated) to each battery monitoring circuit 100 beforehand. The output of this activation signal is performed through a signal path different from that of the communication signal. Then, when activation of each battery monitoring circuit 100 is checked, transmission of a communication signal is started.

Note that in FIG. 1, an assembled battery in which a plurality of cell groups 120, each of which includes serially-connected four cells 110, is connected in series is illustrated as an example of the battery system 130. However, the number of cells 110 included in each cell group 120 is not limited this and may be less than four or equal to or more than four. In an electrically-driven vehicle such as an electric vehicle or a hybrid vehicle, a high-voltage/high-capacity battery module to which many cells or cell groups are connected in series/parallel and both-end voltage of which is around a several hundred volts is generally used. The present invention can be also applied to such a high-voltage/high-capacity battery module.

The battery monitoring circuit 100 is provided to each cell group 120 including the predetermined number of (four in FIG. 1) cells 110 included in the battery system 130. For example, when 100 cells 110 are connected in series in the battery system 130 and are separated into groups by four, 25 cell groups 120 are provided in the battery system 130 and 25 battery monitoring circuits 100 are arranged in the battery system monitoring device 10 accordingly.

Each battery monitoring circuit 100 measures a cell voltage by detecting an interterminal voltage between a positive electrode and a negative electrode of each cell 110 included in a corresponding cell group 120 and transmits the measured cell voltage to the battery controller 200. The battery controller 200 estimates the SOC of each cell 110 based on a result of the measurement of the cell voltage of each cell 110, which result is transmitted from each battery monitoring circuit 100, and outputs a balancing command to each battery monitoring circuit 100. Each battery monitoring circuit 100 performs energization control of the balancing current of each cell 110 according to the balancing command from the battery controller 200. A balancing resistor 102 to determine a balancing current is provided, for each cell 110, between each battery monitoring circuit 100 and a corresponding cell group 120.

During driving of a vehicle, DC power charged in the battery system 130 is supplied to a smoothing capacitor 330 and the inverter 340 through a contactor on a positive electrode side 310 and a contactor on a negative electrode side 320. The inverter 340 converts the DC power supplied from the battery system 130 into AC power and applies the power to the motor 350. The motor 350 is driven with the AC power. In the inverter 340, a switching element (not illustrated) is provided and conversion from the DC power to the AC power is performed by the switching thereof. On the other hand, during breaking of the vehicle, AC power generated by the motor 350 is converted into DC power by a diode element (not illustrated) and the smoothing capacitor 330 which are included in the inverter 340. The DC power is applied to the battery system 130 through the contactor on a positive electrode side 310 and the contactor on a negative electrode side 320 and the battery system 130 is charged. In such a manner, the DC power is exchanged between the battery system 130 and the inverter 340.

Note that a ripple noise and a switching noise are generated along with an operation of the inverter 340. These noises are reduced for a certain degree by the smoothing capacitor 330 but are not removed completely. Then, the noises flow into the battery system 130 and a noise current is generated. In proportion to the noise current, a noise voltage is superimposed on an interterminal voltage of each cell 110 in the battery system 130. Since the noise causes a detection error of a cell voltage, an input into the battery monitoring circuit 100 is controlled by using an RC filter 4 illustrated in FIG. 2 described later.

Figure 2:
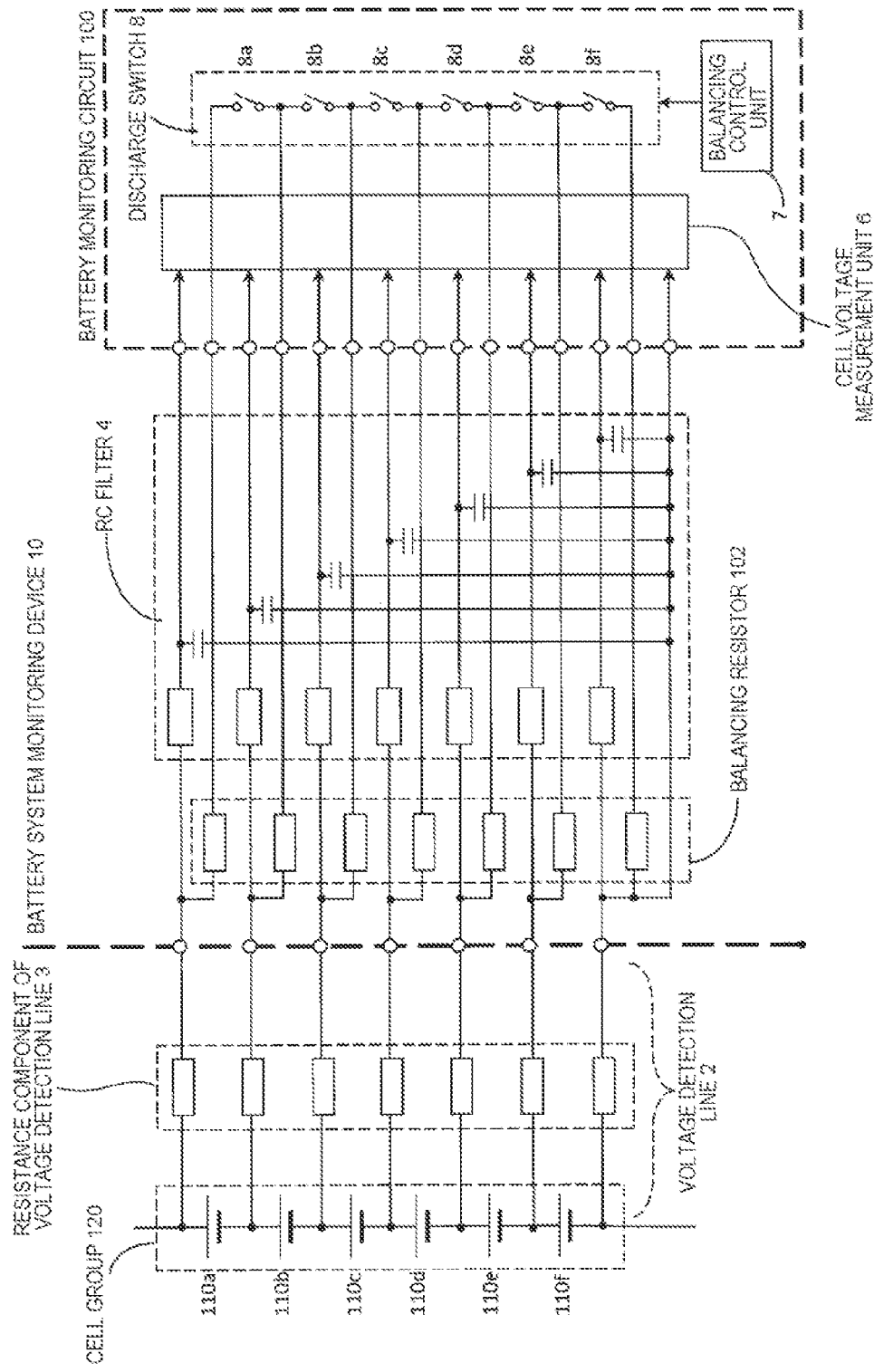
FIG. 2 is a view illustrating a detail of a connection circuit between a cell group and a battery monitoring circuit.

Then, a detail of a connection circuit between each cell group 120 and each battery monitoring circuit 100 in the battery system monitoring device 10 illustrated in FIG. 1 will be described. FIG. 2 is a view illustrating a detail of a connection circuit between each cell group 120 and each battery monitoring circuit 100. Each cell group 120 and each battery monitoring circuit 100 arranged in a corresponding relation illustrated in FIG. 1 are connected to each other through the connection circuit illustrated in FIG. 2. Note that in FIG. 2, six cells 110 included in each cell group 120 are illustrated as cells 110*a* to 110*f*. However, the number of cells 110 included in each cell group 120 is not limited to this. For example, as illustrated in FIG. 1, four cells 110 may be connected in series.

On the outside of the battery system monitoring device 10, a voltage detection line 2 including a resistance component 3 is connected between each of the cells 110*a* to 110*f* in each cell group 120 and the battery monitoring circuit 100. Also, on an inner side of the battery system monitoring device 10, the balancing resistor 102 and the RC filter 4 are connected between each of the cells 110*a* to 110*f* and the battery monitoring circuit 100. As described above, the RC filter 4 is to control a noise to be a measurement error of a cell voltage and includes a resistance and a capacitor.

Each battery monitoring circuit 100 functionally includes a cell voltage measurement unit 6, a balancing control unit 7, and a discharge switch 8. The cell voltage measurement unit 6 measures, at predetermined timing, each cell voltage of each of the cells 110*a* to cell 110*f* which voltage is input through the voltage detection line 2 and the RC filter 4. The cell voltage measured by the cell voltage measurement unit 6 is transmitted to the battery controller 200 with the communication signal.

The discharge switch 8 is provided to each of the cells 110*a* to 110*f*. In FIG. 2, discharge switches 8 are respectively indicated by signs 8*a* to 8*f* while being associated to the cells 110*a* to 110*f*. According to a command from the battery controller 200, the balancing control unit 7 switches opened and closed states of each of the discharge switches 8*a* to 8*f*. In such a manner, when the opened and closed states of each of the discharge switches 8*a* to 8*f* are switched by the balancing control unit 7, a state of a discharge current which flows from each of the cells 110*a* to 110*f* through the balancing resistor 102 is switched and a balancing discharge of each of the cells 110*a* to 110*f* is performed.

Figure 3:
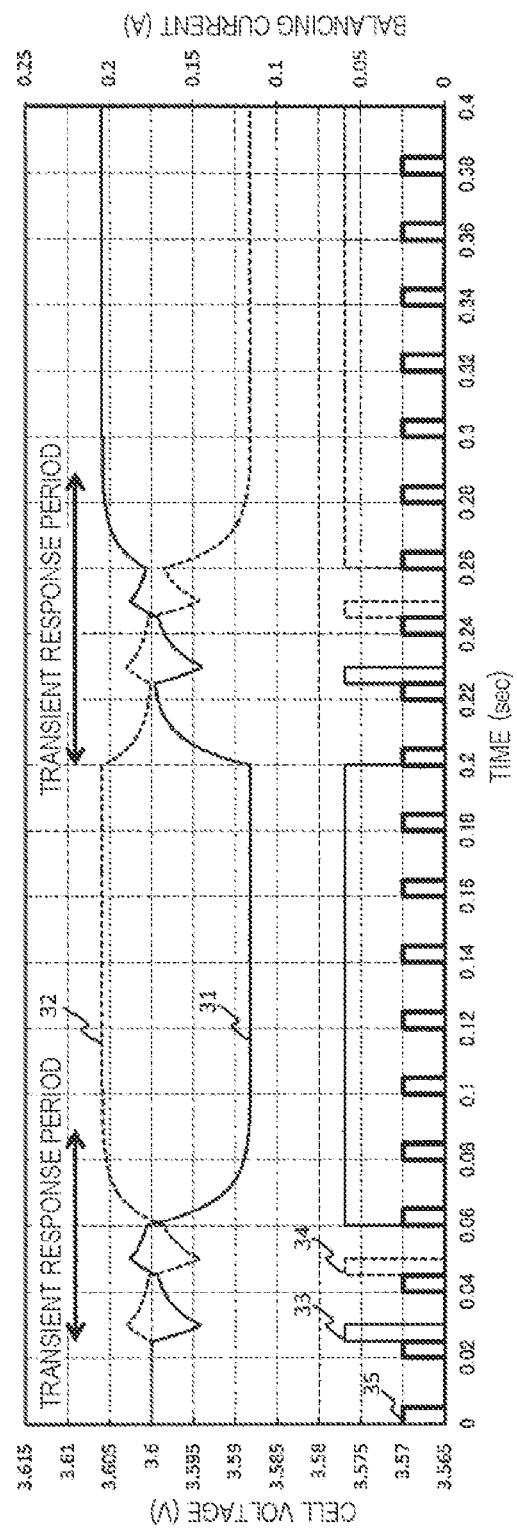
FIG. 3 is a view illustrating an example of timing of measuring a cell voltage and an example of a variation of a balancing current and a cell voltage.

Then, a method of measurement of a cell voltage performed by the cell voltage measurement unit 6 will be described. FIG. 3 is a view illustrating an example of timing of measurement of a cell voltage performed by the cell voltage measurement unit 6 and an example of a variation of a balancing current and a cell voltage. In FIG. 3, a waveform 31 indicated by a solid line on an upper side indicates a cell voltage of a high-order cell and a waveform 32 indicated by a broken line indicates a cell voltage of a low-order cell. Also, a waveform 33 indicated by a solid line on a lower side indicates a balancing current flowing from the high-order cell through the balancing resistor 102 and a waveform 34 indicated by a broken line indicates a balancing current flowing from the low-order cell through the balancing resistor 102. The remaining waveform 35 indicates timing of measuring a cell voltage. Note that the high-order cell is a cell 110 which is odd-numbered when counted from a high voltage side in each cell group 120. In FIG. 2, the cells 110*a*, 110*c*, and 110*e* are the high-order cells. On the other hand, the low-order cell is a cell 110 which is even-numbered when counted from the high voltage side in each cell group 120. In FIG. 2, the cells 110*b*, 110*d*, and 110*f* are the low-order cells.

In FIG. 3, a value in a left vertical axis is a cell voltage value indicated by each of the waveforms 31 and 32. On the other hand, a value in a right vertical axis is a balancing current value indicated by each of the waveforms 33 and 34. Also, a value in a horizontal axis indicates time and is used with respect to the waveforms 31 to 35.

As indicated by the waveform 35, the cell voltage measurement unit 6 measures a cell voltage of each of the cells 110*a* to 110*f* every 0.02 second. The balancing control unit 7 controls the discharge switches 8*a* to 8*f* at timing synchronized with the timing of measuring the cell voltage.

When an operation of each battery monitoring circuit 100 is started at time 0, the balancing control unit 7 closes the discharge switches 8*a*, 8*c*, and 8*e* corresponding to the high-order cells for a short period of time immediately after measurement of a cell voltage performed 0.02 second later. Then, immediately after next timing of measuring a cell voltage, the discharge switches 8*b*, 8*d*, and 8*f* corresponding to the low-order cells are closed for a short period of time. Here, as indicated by the waveforms 33 and 34, a balancing current flows alternately in the high-order cells and the low-order cells. By detecting the balancing current, disconnection detection of the voltage detection line 2 can be performed in the battery monitoring circuit 100.

Then, the balancing control unit 7 controls a discharge switch corresponding to a cell to be balanced among the discharge switches 8*a*, 8*c*, and 8*e* corresponding to the high-order cells and switches the switch into a closed state. Accordingly, a positive electrode and a negative electrode of a cell to be balanced among the cells 110*a*, 110*c*, and 110*e* which are the high-order cells are connected to each other through the balancing resistor 102. Then, as indicated by the waveform 33, the cell discharges current and a balancing current flows.

When the balancing discharge of the high-order cells is over, disconnection detection of the voltage detection line 2 is performed again in the battery monitoring circuit 100. Here, as described above, the balancing control unit 7 alternately closes the discharge switches 8*a*, 8*c*, and 8*e* corresponding to the high-order cells and the discharge switches 8*b*, 8*d*, and 8*f* corresponding to the low-order cells for a short period of time. Then, the balancing control unit 7 performs control, which is similar to that on the discharge switches 8a, 8c, and 8e corresponding to the high-order cells, on the discharge switches 8b, 8d, and 8f corresponding to the low-order cells. That is, a discharge switch corresponding to a cell to be balanced among the discharge switches 8b, 8d, and 8f corresponding to the low-order cells is controlled and switched into a closed state. Accordingly, a positive electrode and a negative electrode of a cell to be balanced among the cells 110b, 110d, and 110f which are the low-order cells are connected to each other through the balancing resistor 102 and the cell discharges current and a balancing current flows as indicated by the waveform 34.

When switching of the discharge switches 8a to 8f is performed at timing described above, cell voltages of the high-order cells and the low-order cells vary in manners respectively indicated by the waveforms 31 and 32. That is, when the discharge switches 8a, 8c, and 8e corresponding to the high-order cells are closed first for a short period of time and a balancing current is supplied to the cells 110a, 110c, and 110e in order to perform disconnection detection of the voltage detection line 2, cell voltages of the high-order cells are decreased and cell voltages of the low-order cells are increased accordingly. When these discharge switches are brought back to the opened state, a balancing current becomes 0 and a cell voltage of each of the high-order cells and the low-order cells varies back to its original level. Subsequently, when the discharge switches 8b, 8d, and 8f corresponding to the low-order cells are closed for a short period of time and a balancing current is supplied to the cells 110b, 110d, and 110f, cell voltages of the low-order cells are decreased and cell voltages of the high-order cells are increased accordingly. When these discharge switches are brought back to the opened state, a balancing current becomes 0 and a cell voltage of each of the high-order cells and the low-order cells varies back to its original level.

After disconnection detection of the voltage detection line 2, balancing discharge of the high-order cells or the low-order cells is performed. When a balancing current is supplied by closing the discharge switch 8a, 8c, or 8e and causing a cell to be balanced to discharge current in the balancing discharge of the high-order cells, cell voltages of the high-order cells are decreased and cell voltages of the low-order cells are increased accordingly. When a predetermined period of time passes after the balancing current starts flowing, these cell voltages become stable at a certain level. Then, when the discharge switch is brought back to the opened state, the balancing current is cut off and a cell voltage of each of the high-order cells and the low-order cells varies back to its original level.

On the other hand, when a balancing current is supplied by closing the discharge switch 8b, 8d, or 8f and causing a cell to be balanced to discharge current in the balancing discharge of the low-order cells, cell voltages of the low-order cells are decreased and cell voltages of the high-order cells are increased accordingly. When a predetermined period passes after the balancing current starts flowing, these cell voltages become stable at a certain level. Then, when the discharge switch is brought back to the opened state, the balancing current is cut off and a cell voltage of each of the high-order cells and the low-order cells varies back to its original level.

As described above, when the discharge switches 8a to 8f are switched from the opened state to the closed state or from the closed state to the opened state, a cell voltage varies transiently for a certain period of time thereafter. A period in which the cell voltage varies transiently in such a manner will be referred to as a transient response period in the following. In the example illustrated in FIG. 3, a period illustrated in the drawing corresponds to the transient response period. The period is a period until a cell voltage becomes stable during a balancing discharge of the high-order cells or the low-order cells after the discharge switches 8a, 8c, and 8e corresponding to the high-order cells are switched from the opened state to the closed state in order to perform disconnection detection of the voltage detection line 2. A length of the transient response period is determined according to a time constant of the RC filter 4.

In the battery system monitoring device 10 according to the present embodiment, a measurement result of a cell voltage is corrected in the cell voltage measurement unit 6 in consideration of such a variation of a cell voltage in the transient response period. This point will be described in detail in the following.

Figure 4:
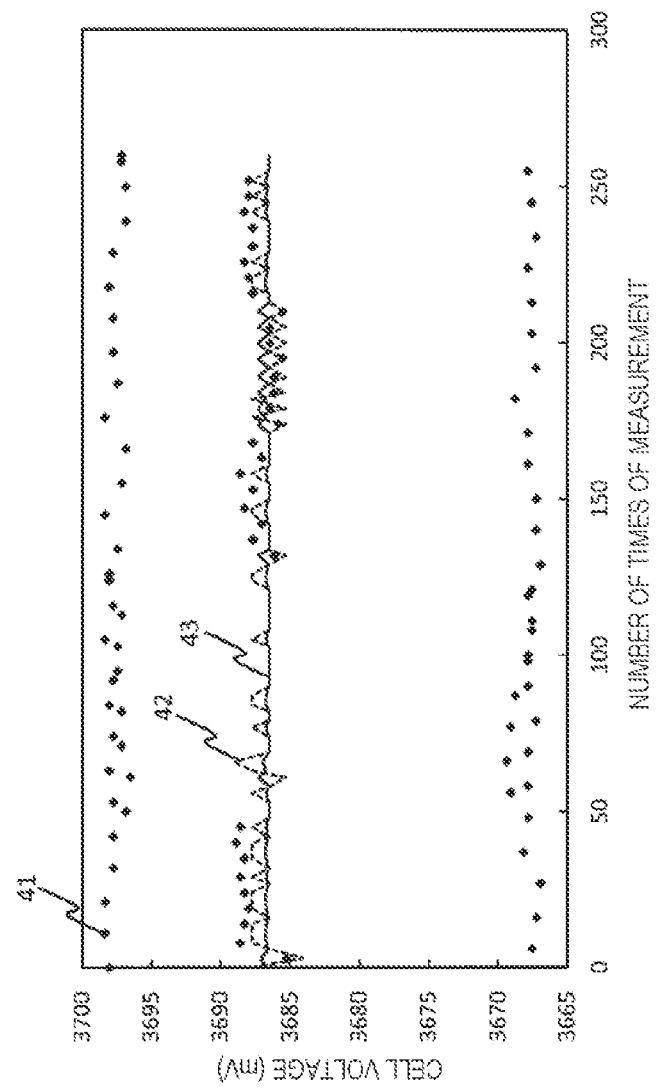
FIG. 4 is a view illustrating an example of a correction result of a cell voltage.

FIG. 4 is a view illustrating an example of a correction result of the cell voltage. In FIG. 4, each point represented by a point indicated by a sign 41 indicates a measurement value of a cell voltage which is not yet corrected. Since a measurement value of a cell voltage which is not yet corrected includes an error due to a voltage drop generated by a flow of a balancing current in the resistance component 3 illustrated in FIG. 2, there is a variation in upper and lower sides. On the other hand, a broken line indicated by a sign 42 indicates a cell voltage corrected by a conventional correction method. The corrected cell voltage can be acquired by correction of an amount of a voltage drop of the resistance component 3 with respect to a measurement value of a cell voltage not yet corrected. In such a manner, by correcting an amount of the voltage drop due to the resistance component 3, it is possible to reduce an error included in the measurement value of the cell voltage.

On the other hand, a solid line indicated by a sign 43 indicates a corrected cell voltage acquired in the battery system monitoring device 10 of the present embodiment. With the cell voltage measurement unit 6 of each battery monitoring circuit 100, the battery system monitoring device 10 corrects an amount of a voltage drop due to the resistance component 3 with respect to the measurement value of the cell voltage of each cell 110. Here, a correction value in which a variation of a cell voltage illustrated in FIG. 3 is considered is used with respect to a cell voltage measured in the transient response period. Accordingly, an error included in the measurement value of the cell voltage can be further reduced compared to the conventional correction method.

Figure 5:
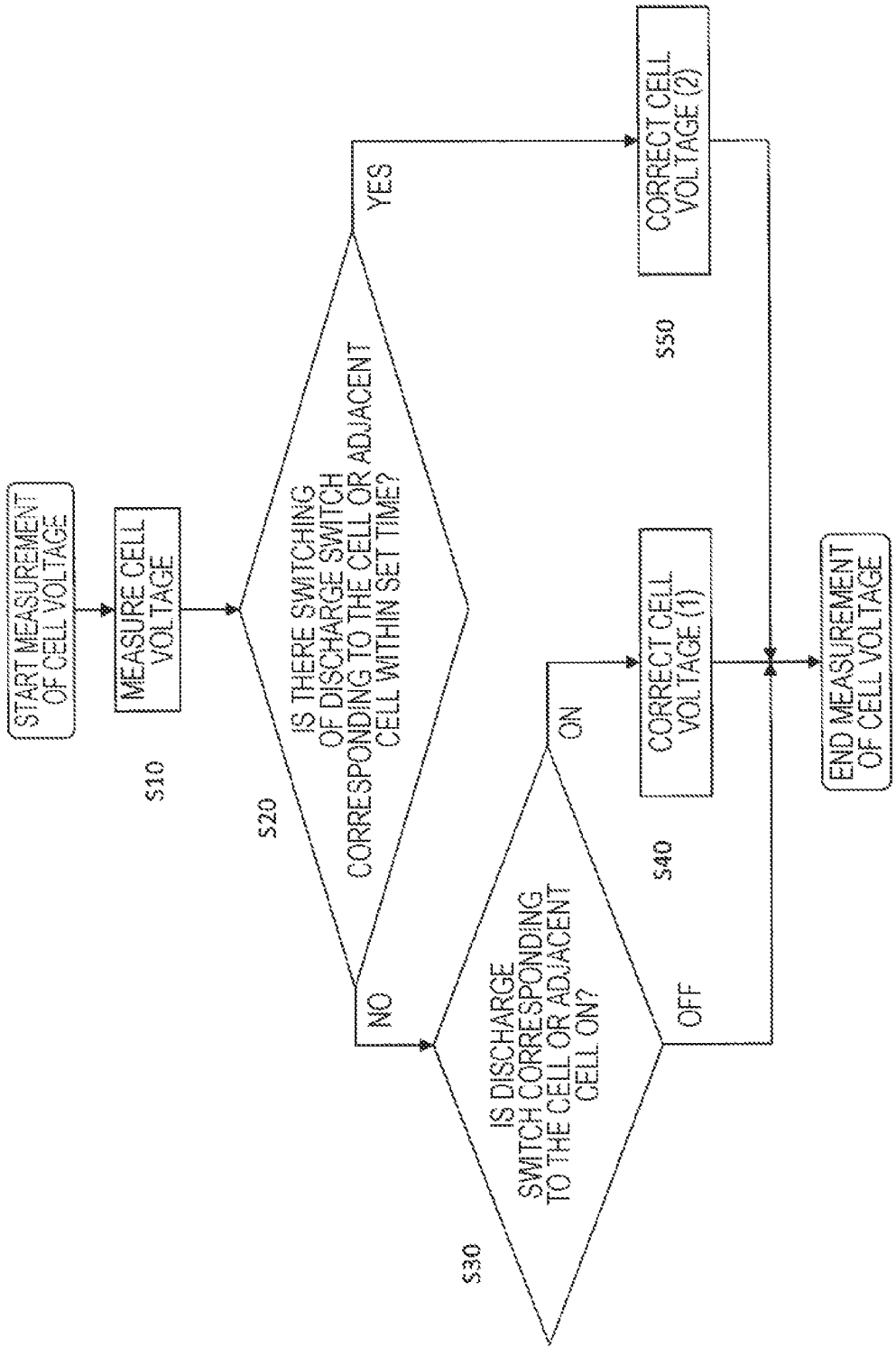
FIG. 5 is a flowchart illustrating a procedure of cell voltage measurement processing.

FIG. 5 is a flowchart illustrating a procedure of cell voltage measurement processing in the battery system monitoring device 10. The cell voltage measurement processing is executed, in the battery system monitoring device 10, by the cell voltage measurement unit 6 of the battery monitoring circuit 100.

In step S10, the cell voltage measurement unit 6 measures a cell voltage of each cell 110 in a corresponding cell group 120. Here, a potential difference in voltages of both ends of each cell 110 which voltages are input into the cell voltage measurement unit 6 from each cell 110 through the voltage detection line 2 and the RC filter 4 is measured, whereby a cell voltage of each cell 110 is measured.

In step S20, the cell voltage measurement unit 6 determines, with respect to each cell 110 a cell voltage of which is measured in step S10, whether switching of a discharge switch 8 corresponding to the cell or switching of a discharge switch 8 corresponding to a cell adjacent to the cell is performed within predetermined set time before a time point of the measurement. When a switching state of at least one of these discharge switches is changed within the set time, it is determined that a cell voltage of the cell is measured in the transient response period and processing goes to step S50. On the other hand, when switching states of all of these discharge switches are not changed within the set time, it is determined that cell voltages of these cells are not measured within the transient response period and the processing goes to step S30.

For example, it is assumed that at least one of the discharge switch 8b corresponding to the cell 110b in FIG. 2 and the discharge switches 8a and 8c respectively corresponding to the cells 110a and 110c adjacent to the cell 110b is switched in the predetermined set time before timing of measuring a cell voltage of the cell 110b. In this case, in step S20 in FIG. 5, it is determined that the cell voltage of the cell 110b is measured within the transient response period and the processing goes to step S50. On the other hand, when switching of these discharge switches is not performed within the set time, it is determined that the cell voltage of the cell 110b is not measured within the transient response period and the processing goes to step S30.

In step S30, the following is performed with respect to each cell 110 on which a determination is made in step S20 that a cell voltage thereof is not measured within the transient response period. That is, the cell voltage measurement unit 6 determines whether a switching state of a discharge switch 8 corresponding to the cell or a discharge switch 8 corresponding to a cell adjacent to the cell is on in the measurement of a cell voltage of the cell. When a switching state of at least one of these discharge switches is on, that is, in the closed state in the measurement of the cell voltage, it is determined that the cell voltage is measured during the balancing discharge and the processing goes to step S40. On the other hand, when switching states of all of these discharge switches are off, that is, in the opened state in the measurement of the cell voltage, it is determined that the cell voltage is not measured during the balancing discharge. In this case, correction of a cell voltage measurement value is not performed and the processing illustrated in the flowchart in FIG. 5 is ended.

In step S40, the cell voltage measurement unit 6 performs correction by a first correction method with respect to the cell voltage measurement value of each cell 110, it being determined in step S30 that the value is measured during the balancing discharge. Here, the cell voltage measurement value is corrected by using a first correction voltage Vc calculated by the following expression (1) based on a measurement value Id of a discharge current and a resistance value Rs of the resistance component 3.

$$Vc = Id \times Rs \qquad (1)$$

In the following, a detail method of correcting a cell voltage measurement value by using the first correction voltage Vc is considered. First, a case where a discharge switch 8 corresponding to the cell 110 a cell voltage of which is measured (cell to be measured) is on is considered. In this case, a balancing current from the cell to be measured passes through a voltage detection line 2 connected to each of a positive electrode side and a negative electrode side of the cell to be measured. Here, a voltage drop is generated by the resistance component 3 of each of these voltage detection lines 2, whereby a positive voltage is measured as a value lower than an original value and a negative voltage is measured as a value higher than an original value. As a result, a measurement value of the cell voltage becomes lower for a summed amount of voltage drops in the resistance components 3. Thus, in this case, it is possible to correct the cell voltage measurement value by adding, to the measurement value of the cell voltage, a value which is the sum of first correction voltages Vc calculated by the above equation (1) with respect to the resistance components 3.

Then, a case where a discharge switch 8 corresponding to the cell 110 (adjacent cell) adjacent to a high-order side of the cell 110 a cell voltage of which is measured (cell to be measured) is on is considered. In this case, a balancing current from the adjacent cell passes through the voltage detection line 2 connected to both of a negative electrode side of the adjacent cell and the positive electrode side of the cell to be measured. Here, due to the resistance component 3 of the voltage detection line 2, a voltage drop is generated in a direction from the cell voltage measurement unit 6 toward the positive electrode side of the cell to be measured. Thus, a positive voltage higher than an original value is measured. As a result, a measurement value of the cell voltage becomes higher for an amount of the voltage drop of the resistance component 3. Thus, it is possible to correct the cell voltage measurement value by subtracting the first correction voltage Vc from the measurement value of the cell voltage.

Also, a case where a discharge switch 8 corresponding to the cell 110 (adjacent cell) adjacent to a low-order side of the cell 110 a cell voltage of which is measured (cell to be measured) is on is considered. In this case, a balancing current from the adjacent cell passes through the voltage detection line 2 connected to both of a positive electrode side of the adjacent cell and the negative electrode side of the cell to be measured. Here, since a voltage drop is generated in a direction from the negative electrode side of the cell to be measured toward the cell voltage measurement unit 6 due to the resistance component 3 of the voltage detection line 2, a negative voltage lower than an original value is measured. As a result, similarly to the above case, the measurement value of the cell voltage is increased for an amount of the voltage drop of the resistance component 3. Thus, in this case, it is also possible to correct the cell voltage measurement value by subtracting the first correction voltage Vc from the measurement value of the cell voltage.

In step S40, by the above-described method, it is possible to correct the cell voltage measurement value. When the cell voltage measurement value is corrected in step S40, the processing illustrated in the flowchart in FIG. 5 is ended.

In step S50, the cell voltage measurement unit 6 performs correction by a second correction method with respect to a cell voltage measurement value of each cell 110, it being determined in step S20 that the value is measured in the transient response period. Here, a second correction voltage Vt is calculated by multiplying the first correction voltage Vc, which is calculated by the above-described expression (1), by a predetermined transient response coefficient K according to the following expression (2). The cell voltage measurement value is corrected by using the second correction voltage Vt calculated in such a manner. Note that in the expression (2), the transient response coefficient K is a value, which is equal to or larger than 0 and is smaller than 1, and can be set previously according to a time constant of the RC filter 4. That is, the second correction voltage Vt is smaller than the first correction voltage Vc and a percentage thereof is determined according to a time constant of the RC filter 4.

$$Vt = K \times Vc \qquad (2)$$

In step S50, similarly to step S40, it is also possible to correct a cell voltage measurement value by using different calculation methods in a case where a discharge switch 8 corresponding to a cell 110 a cell voltage of which is measured is switched within the transient response period and a case where a discharge switch 8 corresponding to a cell 110 adjacent to a high-order side or a low-order side of the cell 110 a cell voltage of which is measured is switched within the transient response period. That is, when the discharge switch 8 corresponding to the cell 110 a cell voltage of which is measured (cell to be measured) is switched within the transient response period, it is possible to correct a cell voltage measurement value by calculating a second correction voltage Vt with respect to the resistance component 3 of the voltage detection line 2 connected to each of the positive electrode side and the negative electrode side of the cell to be measured and by adding a summed value of these to the measurement value of the cell voltage. On the other hand, when the discharge switch 8 corresponding to the cell 110 (adjacent cell) adjacent to the high-order side or low-order side of the cell 110 a cell voltage of which is measured (cell to be measured) is switched within the transient response period, it is possible to correct the cell voltage measurement value by calculating the second correction voltage Vt with respect to the resistance component 3 of the voltage detection line 2 connected to both of the cell to be measured and the adjacent cell and by subtracting this from the measurement value of the cell voltage.

When the cell voltage measurement value is corrected in step S50 by the above-described method, the processing illustrated in the flowchart in FIG. 5 is ended.

Next, a method of measuring the resistance component 3 of each voltage detection line 2 will be described. As the resistance value Rs of the resistance component 3 in the above expression (1), an actual measurement value may be used other than a previously-set value. In this case, by a procedure described in the following, a measurement value of the cell voltage of when current does not flow from each cell 110 to each balancing resistor 102 and a measurement value of the cell voltage of when current flows from each cell 110 to each balancing resistor 102 are acquired. Based on these values, a resistance value Rs of a resistance component 3 included in each voltage detection line 2 connected between each cell 110 and the cell voltage measurement unit 6 is calculated. Based on a result of the calculation of the resistance value Rs, the first correction voltage Vc and the second correction voltage Vt can be respectively determined according to the above-described expressions (1) and (2).

Figure 6:
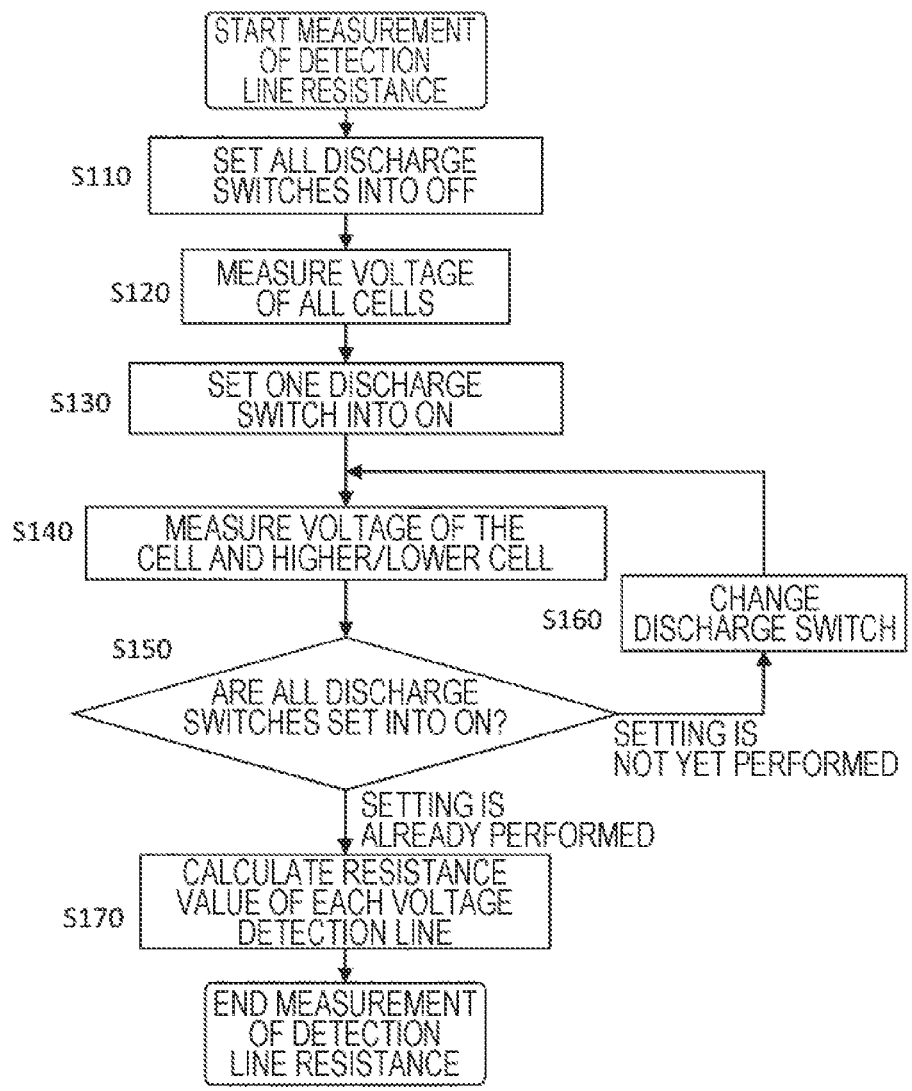
FIG. 6 is a flowchart illustrating a procedure of detection line resistance measurement processing.

FIG. 6 is a flowchart illustrating a procedure of detection line resistance measurement processing in the battery system monitoring device 10. The detection line resistance measurement processing is executed by the cell voltage measurement unit 6 and the balancing control unit 7 of each battery monitoring circuit 100 in the battery system monitoring device 10. Note that the processing illustrated in the flowchart in FIG. 6 is preferably performed when a state of the battery system 130 is stable. For example, the processing is preferably performed during activation of a vehicle system including the battery system monitoring device 10 or immediately before the system is stopped.

In step S110, the balancing control unit 7 sets all of the discharge switches 8 into the off-state. Subsequently, in step S120, the cell voltage measurement unit 6 measures cell voltages of all cells 110 in the opened state.

In step S130, the balancing control unit 7 sets one of the discharge switches 8, which are set into the off-state in step S110, into an on-state. Subsequently, in step S140, the cell voltage measurement unit 6 measures cell voltages in a discharging state of a cell 110 corresponding to the discharge switch 8 which is set into the on-state in step S130 and that of cells 110 respectively adjacent to a high-order side and a low-order side of the cell.

In step S150, the balancing control unit 7 determines whether all of the discharge switches 8 are set into the on-state. In step S130 described above and step S160 described later, the processing goes to step S170 when all of the discharge switches 8 are set into the on-state and the processing goes to step S160 when there is a discharge switch 8 which is not set into the on-state.

In step S160, the balancing control unit 7 changes a discharge switch 8 to be set into the on-state. Here, one of the discharge switches 8 which are not yet set into the on-state is selected. Then, the discharge switch 8 is set into the on-state and the other discharge switches 8 are set into the off-state. When step S160 is executed, the processing goes to step S140. Then, a cell voltage in a discharging state of a cell 110 corresponding to the discharge switch 8 which is set into the on-state and that of cells 110 respectively adjacent to the high-order side and the low-order side of the cell is measured. The processing in step S160 and the processing in step S140 are repeatedly performed, whereby cell voltages of all of the cells 110 in the discharging state are measured.

In step S170, based on the cell voltage of each cell 110 in the opened state which voltage is measured in step S120 and the cell voltage of each cell 110 in the discharging state which voltage is measured in step S140, the cell voltage measurement unit 6 calculates the resistance value Rs of the resistance component 3 included in each voltage detection line 2. Here, it is possible to calculate the resistance value Rs by a method described in the following. When the resistance value Rs is calculated in step S170, the processing illustrated in the flowchart in FIG. 6 is ended.

Figure 7:
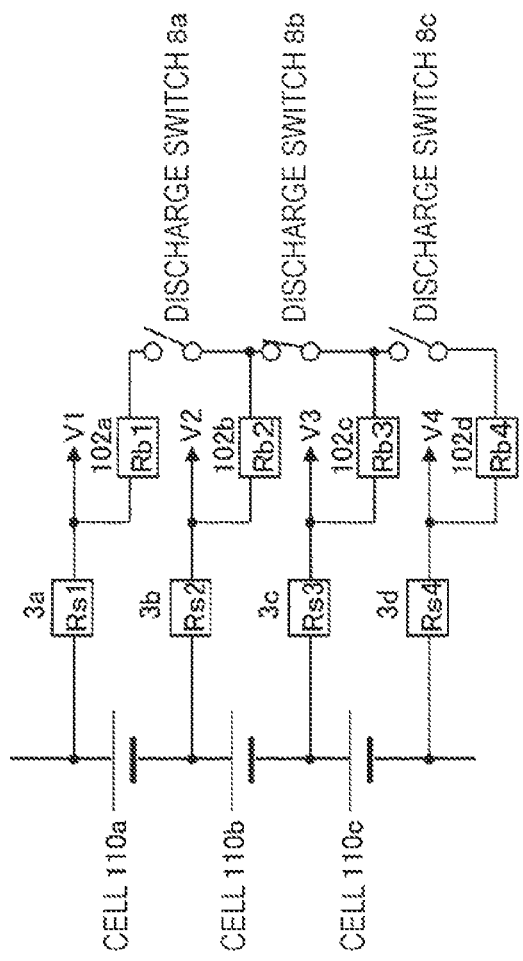
FIG. 7 is a view for describing a method of calculating a resistance value of a resistance component included in a voltage detection line.

In the following, a method of calculating the resistance value Rs in step S170 will be described. FIG. 7 is a view for describing a method of calculating the resistance value Rs of the resistance component 3 included in each voltage detection line 2. In this view, an example in which resistance components 3*a* to 3*d* are respectively included in the voltage detection lines 2 which are respectively connected to the three cells 110*a*, 110*b*, and 110*c* is illustrated for the sake of simplification.

In FIG. 7, a cell voltage of the cell 110*a* is measured as a difference between a voltage detection value V1 and a voltage detection value V2. Similarly, the cell voltage of the cell 110*b* is measured as a difference between the voltage detection value V2 and a voltage detection value V3 and a cell voltage of the cell 110*c* is measured as a difference between the voltage detection value V3 and a voltage detection value V4. In the following, cell voltages of the cells 110*a*, 110*b*, and 110*c* which voltages are measured when all of the discharge switches 8*a*, 8*b*, and 8*c* are in the opened state are respectively referred to as V0*a*, V0*b*, and V0*c*. Also, cell voltages of the cells 110*a*, 110*b*, and 110*c* which voltages are measured when the discharge switches 8*a* and 8*c* are in the opened state and the discharge switch 8*b* is in the on-state are respectively referred to as V1*a*, V1*b*, and V1*c*.

Here, when the discharge switch 8*b* is brought into the on-state, the cell 110*b* discharges a current and a balancing current flows. The balancing current serially passes through the resistance component 3*b*, a balancing resistor 102*b*, the discharge switch 8*b*, a balancing resistor 102*c*, and the resistance component 3*c*. A current value I2 of this balancing current can be expressed by the following expression (3)

when resistance values of the balancing resistors 102b and 102c are respectively assumed as Rb2 and Rb3.

$$I2 = V1b/(Rb2+Rb3) \quad (3)$$

When the discharge switch 8b is in the on-state, the balancing current flows in the voltage detection line 2 connected between the cell 110b and the cell 110c. Thus, a cell voltage detected with respect to the cell 110c is increased. An amount of the increase in the cell voltage can be expressed by the following expression (4).

$$V1c - V0c = I2 \times Rs3 \quad (4)$$

According to the above-described expressions (3) and (4), a resistance value Rs3 of the resistance component 3c included in the voltage detection line 2 connected between the cell 110b and the cell 110c can be calculated by the following expression (5).

$$Rs3 = (V1c - V0c)/I2 \quad (5)$$
$$= (V1c - V0c) \times (Rb2 + Rb3)/V1b$$

Also, in a similar manner, a cell voltage detected with respect to the cell 110a is increased when a balancing current flows in the voltage detection line 2 connected between the cell 110a and the cell 110b. An amount of the increase in the cell voltage can be expressed by the following expression (6).

$$V1a - V0a = I2 \times Rs2 \quad (6)$$

According to the above-described expressions (3) and (6), a resistance value Rs2 of the resistance component 3b included in the voltage detection line 2 connected between the cell 110a and the cell 110b can be calculated by the following expression (7).

$$Rs2 = (V1a - V0a)/I2 \quad (7)$$
$$= (V1a - V0a) \times (Rb2 + Rb3)/V1b$$

Then, the discharge switch 8b is brought back to the off-state and the discharge switch 8a is brought into the on-state. A cell voltage of the cell 110a which voltage is measured at this time is referred to as V2a in the following.

When the discharge switch 8a is brought into the on-state, the cell 110a discharges a current and a balancing current flows. The balancing current serially passes through the resistance component 3a, a balancing resistor 102a, the discharge switch 8a, the balancing resistor 102b, and the resistance component 3b. A current value I1 of this balancing current can be expressed by the following expression (8) when resistance values of the balancing resistors 102a and 102b are respectively assumed as Rb1 and Rb2.

$$I1 = V2a/(Rb1+Rb2) \quad (8)$$

When the discharge switch 8a is in the on-state, a cell voltage detected with respect to the cell 110a is decreased due to the balancing current. An amount of the decrease in the cell voltage can be expressed by the following expression (9).

$$V0a - V2a = I1 \times (Rs1+Rs2) \quad (9)$$

According to the above-described expressions (8) and (9), a resistance value Rs1 of the resistance component 3a included in the voltage detection line 2 connected to a positive electrode side of the cell 110a can be calculated by the following expression (10). Note that in the expression (10), what is calculated by the above-described expression (7) can be used as the resistance value Rs2 of the resistance component 3b.

$$Rs1 = (V0a - V2a)/I1 - Rs2 \quad (10)$$
$$= (V0a - V2a) \times (Rb1 + Rb2)/V2a - Rs2$$

Then, the discharge switch 8a is brought back to the off-state and the discharge switch 8c is brought into the on-state. A cell voltage of the cell 110c which voltage is measured at this time is referred to as V3c in the following.

When the discharge switch 8c is brought into the on-state, the cell 110c discharges current and a balancing current flows. The balancing current serially passes through the resistance component 3c, the balancing resistor 102c, the discharge switch 8c, a balancing resistor 102d, and the resistance component 3d. A current value I3 of the balancing current can be expressed by the following expression (11) when resistance values of the balancing resistors 102c and 102d are respectively assumed as Rb3 and Rb4.

$$I3 = V3c/(Rb3+Rb4) \quad (11)$$

When the discharge switch 8c is in the on-state, a cell voltage detected with respect to the cell 110c is decreased due to the balancing current. An amount of the decrease in the cell voltage can be expressed by the following expression (12).

$$V0c - V3c = I3 \times (Rs3+Rs4) \quad (12)$$

According to the above-described expressions (11) and (12), a resistance value Rs4 of the resistance component 3d included in the voltage detection line 2 connected to a negative electrode of the cell 110c can be calculated by the following expression (13). Note that in the following expression (13), what is calculated by the above-described expression (5) can be used as the resistance value Rs3 of the resistance component 3c.

$$Rs4 = (V0c - V3c)/I3 - Rs3 \quad (13)$$
$$= (V0c - V3c) \times (Rb3 + Rb4)/V3c - Rs3$$

In step S170 in FIG. 6, it is possible to calculate the resistance value Rs of the resistance component 3 included in each of the voltage detection lines 2 by the above-described method. Note that in the above-described description, an example in FIG. 7 in which example the three cells 110a, 110b, and 110c are connected in series has been described. However, a similar calculation method can be applied regardless of the number of cells 110 included in the cell group 120.

According to the above-described embodiment of the present invention, the following effects can be acquired.

(1) The battery system 130 includes a plurality of cell groups 120 in each of which a plurality of single battery cells 110 is connected in series. The battery system monitoring device 10 to monitor and control the battery system 130 includes the battery monitoring circuit 100 provided to each cell group 120. Each battery monitoring circuit 100 includes the cell voltage measurement unit 6, the balancing control unit 7, and the discharge switch 8. The RC filter 4 is connected between the cell voltage measurement unit 6 and each of the single battery cells 110. The cell voltage measurement unit 6 determines whether a cell voltage is measured in a transient response period corresponding to a time constant of the RC filter 4 (step S20) and corrects a measurement value of the cell voltage by using a correction value corresponding to a result of the determination (step S40 and S50). Accordingly, it is possible to provide the battery system monitoring device 10 which can accurately measure a cell voltage even in a period of the transient response.

(2) In step S20, when a switching state of a discharge switch 8 corresponding to a single battery cell 110 a cell voltage of which is measured or a switching state of a discharge switch 8 corresponding to a single battery cell 110 adjacent to the single battery cell 110 a cell voltage of which is measured is changed within a predetermined set time before the measurement of cell voltage, the cell voltage measurement unit 6 determines that a cell voltage is measured within the transient response period. On the other hand, when a switching state of the discharge switch 8 corresponding to the single battery cell 110 a cell voltage of which is measured or a switching state of the discharge switch 8 corresponding to the single battery cell 110 adjacent to the single battery cell 110 a cell voltage of which is measured is not changed within the predetermined set time before the cell voltage is measured, it is determined that the cell voltage is not measured within the transient response period. Accordingly, it is possible to securely determine whether a cell voltage is measured within the transient response period corresponding to a time constant of the RC filter 4.

(3) When it is determined in step S20 that the cell voltage is not measured within the transient response period, the cell voltage measurement unit 6 determines whether at least one of the discharge switch 8 corresponding to the single battery cell 110 a cell voltage of which is measured and the discharge switch 8 corresponding to the single battery cell 110 adjacent to the single battery cell 110 a cell voltage of which is measured is on or off during the measurement of the cell voltage (step S30). Then, when it is determined that at least one of the discharge switches 8 is on, a measurement value of the cell voltage is corrected by using the first correction voltage Vc (step S40). Also, when it is determined in step S20 that the cell voltage is measured within the transient response period, a measurement value of the cell voltage is corrected by using the second correction voltage Vt lower than the first correction voltage Vc (step S50). Accordingly, it is possible to correct a measurement value of a cell voltage by using an appropriate correction voltage when the cell voltage is measured or not measured within the transient response period.

(4) The balancing control unit 7 controls the discharge switch 8 at timing synchronized with timing of measurement of the cell voltage performed by the cell voltage measurement unit 6. Accordingly, it is possible to securely specify a switching state of the discharge switch 8 in a case where the cell voltage is measured and to correct a measurement value of the cell voltage adequately according to the switching state.

(5) By the detection line resistance measurement processing illustrated in FIG. 6, the cell voltage measurement unit 6 calculates a resistance value of the voltage detection line 2 connected between each single battery cell 110 and the cell voltage measurement unit 6 based on a measurement value of a cell voltage of when current does not flow from the single battery cell 110 to the balancing resistor 102 and a measurement value of a cell voltage of when current flows from the single battery cell 110 to the balancing resistor 102. Based on a result of the calculation, it is possible to determine a correction value used in each of step S40 and step S50 in FIG. 5. Accordingly, it is possible to correct a measurement value of a cell voltage more accurately by using a result of actual measurement of a resistance value Rs of the resistance component 3 included in the voltage detection line 2.

Note that in the above-described embodiment, when a measurement value of a cell voltage is corrected by using the second correction voltage Vt in step S50, an amount of the second correction voltage Vt may be changed according to timing of measuring the cell voltage. For example, with respect to measurement of a cell voltage performed within the transient response period, a value of a transient response coefficient K which varies according to time passed after timing of switching a discharge switch 8 which causes a transient response of the cell voltage is previously set. By using this transient response coefficient K, it is possible to change an amount of the second correction voltage Vt at timing of each measurement of a cell voltage by calculating the second correction voltage Vt according to the above-described expression (2).

As described above, when the cell voltage measurement unit 6 determines in step S20 that a cell voltage is measured within the transient response period, it is possible to vary a correction value in step S50 according to time until a cell voltage is measured after a switching state of a discharge switch 8 corresponding to a single battery cell 110 a cell voltage of which is measured or a switching state of a discharge switch 8 corresponding to a single battery cell 110 adjacent to the single battery cell 110 a cell voltage of which is measured is changed. Accordingly, a result of the measurement of a cell voltage in the transient response period can be corrected more accurately.

The above-described embodiment or modification is just an example and the present invention is not limited to contents thereof as long as a characteristic of the invention is not damaged.

The invention claimed is:

1. A battery system monitoring device configured to monitor and control a battery system including a plurality of cell groups in each of which a plurality of single battery cells is connected in series, the device comprising:
   a plurality of battery monitoring circuits provided in each of the cell groups; and
   a balancing resistor configured to cause each of the single battery cells in a cell group corresponding to each of the battery monitoring circuits to discharge current, wherein
   each of the battery monitoring circuits includes a cell voltage measurement unit configured to measure a cell voltage of each of the single battery cells in the corresponding cell group at a predetermined timing, a discharge switch configured to switch a state of a discharge current which flows from each of the single battery cells in the corresponding cell group through the balancing resistor, and a balancing control unit configured to control the discharge switch,
   a filter circuit is connected between the cell voltage measurement unit and each of the single battery cells,
   the cell voltage measurement unit determines whether the cell voltage is measured within a transient response period corresponding to a time constant of the filter circuit and corrects a measurement value of the cell voltage by using a correction value corresponding to a result of the determination, the cell voltage measurement unit determines that the cell voltage is measured within the transient response period when a switching state of a discharge switch corresponding to a single battery cell a cell voltage of which is measured or a switching state of a discharge switch corresponding to a single battery cell adjacent to the single battery cell the cell voltage of which is measured is changed within a predetermined set time before measurement of the cell voltage, and the cell voltage measurement unit determines that the cell voltage is not measured within the transient response period when a switching state of the discharge switch corresponding to the single battery cell the cell voltage of which is measured or a switching state of the discharge switch corresponding to the single battery cell adjacent to the single battery cell the cell voltage of which is measured is not changed within the predetermined set time before measurement of the cell voltage.

2. The battery system monitoring device according to claim 1, wherein when the cell voltage measurement unit determines that the cell voltage is measured within the transient response period, the correction value is varied according to time until the cell voltage is measured after the switching state of the discharge switch corresponding to the single battery cell the cell voltage of which is measured or the switching state of the discharge switch corresponding to the single battery cell adjacent to the single battery cell the cell voltage of which is measured is changed.

3. The battery system monitoring device according to claim 1, wherein when it is determined that the cell voltage is not measured within the transient response period, the cell voltage measurement unit determines whether at least one of the discharge switch corresponding to the single battery cell the cell voltage of which is measured and the discharge switch corresponding to the single battery cell adjacent to the single battery cell the cell voltage of which is measured is on or off during the measurement of the cell voltage and corrects the measurement value of the cell voltage by using a first correction value when it is determined that at least one of the discharge switches is on, and the cell voltage measurement unit corrects the measurement value of the cell voltage by using a second correction value smaller than the first correction value when determining that the cell voltage is measured within the transient response period.

4. The battery system monitoring device according to claim 1, wherein the balancing control unit controls each of the discharge switches at timing synchronized with timing of measurement of the cell voltage performed by the cell voltage measurement unit.

5. The battery system monitoring device according to claim 1, wherein the cell voltage measurement unit calculates a resistance value of a voltage detection line connected between each of the single battery cells and the cell voltage measurement unit, based on a measurement value of the cell voltage of when current does not flow from the single battery cell to the balancing resistor and a measurement value of the cell voltage of when current flows from the single battery cell to the balancing resistor, and determines the correction value based on a result of the calculation.

6. A battery system monitoring device configured to monitor and control a battery system including a plurality of cell groups in each of which a plurality of single battery cells is connected in series, the device comprising:

a plurality of battery monitoring circuits provided in each of the cell groups; and a balancing resistor configured to cause each of the single battery cells in a cell group corresponding to each of the battery monitoring circuits to discharge current, wherein each of the battery monitoring circuits includes a cell voltage measurement unit configured to measure a cell voltage of each of the single battery cells in the corresponding cell group at a predetermined timing, a discharge switch configured to switch a state of a discharge current which flows from each of the single battery cells in the corresponding cell group through the balancing resistor, and a balancing control unit configured to control the discharge switch, a filter circuit is connected between the cell voltage measurement unit and each of the single battery cells, the cell voltage measurement unit determines whether the cell voltage is measured within a transient response period corresponding to a time constant of the filter circuit and corrects a measurement value of the cell voltage by using a correction value corresponding to a result of the determination, and the cell voltage measurement unit calculates a resistance value of a voltage detection line connected between each of the single battery cells and the cell voltage measurement unit, based on a measurement value of the cell voltage of when current does not flow from the single battery cell to the balancing resistor and a measurement value of the cell voltage of when current flows from the single battery cell to the balancing resistor, and determines the correction value based on a result of the calculation.

* * * * *